United States Patent
Harada et al.

(10) Patent No.: US 10,948,817 B2
(45) Date of Patent: Mar. 16, 2021

(54) MOLD-FORMING SUBSTRATE AND INSPECTION METHOD

(75) Inventors: Daijitsu Harada, Joetsu (JP); Masaki Takeuchi, Joetsu (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 1378 days.

(21) Appl. No.: 13/369,459

(22) Filed: Feb. 9, 2012

(65) Prior Publication Data
US 2012/0207865 A1 Aug. 16, 2012

(30) Foreign Application Priority Data

Feb. 10, 2011 (JP) .............................. JP2011-027405

(51) Int. Cl.
G03F 1/60 (2012.01)
G03F 7/00 (2006.01)
B82Y 40/00 (2011.01)
B82Y 10/00 (2011.01)

(52) U.S. Cl.
CPC ............ G03F 7/0002 (2013.01); B82Y 10/00 (2013.01); B82Y 40/00 (2013.01); G03F 1/60 (2013.01)

(58) Field of Classification Search
CPC ....................................................... G03F 1/60
See application file for complete search history.

(56) References Cited

U.S. PATENT DOCUMENTS 6,162,564 A * 12/2000 Hieda et al. ................. 430/5
6,869,732 B2 3/2005 Takeuchi et al.
2004/0192171 A1 9/2004 Koike
2006/0068300 A1 3/2006 Tanabe et al.
2009/0017257 A1 1/2009 Otsuka et al.
2011/0089612 A1 4/2011 Ikuta et al.

FOREIGN PATENT DOCUMENTS

| CN | 1755519 A | 4/2006 |
|---|---|---|
| EP | 1253117 A1 | 10/2002 |
| JP | 2002-318450 A | 10/2002 |
| WO | 2007/132320 A2 | 11/2007 |
| WO | 2009/034954 A1 | 3/2009 |

OTHER PUBLICATIONS

European Search Report dated Jun. 13, 2012, issued in corresponding European Patent Application No. 12154572.7 (8 pages).
Pritschow M et al., "Fabrication of nano-imprint templates for dual-Damascene applications using a high resolution variable shape E-beam writer", Proceedings of the SPIE—The International Society for Optical Engineering SPIE, vol. 6730, 67300G, 2007, pp. 1-12, XP002676539.
Office Action dated Jun. 3, 2015, issued in counterpart Chinese application No. 201210088083.5, w/English Translation. (20 pages).

* cited by examiner

Primary Examiner — Ryan M Ochylski
(74) Attorney, Agent, or Firm — Westerman, Hattori, Daniels & Adrian, LLP

(57) ABSTRACT

A circular mold-forming substrate of 125-300 mm diameter having a surface on which a topological pattern is to be formed is provided wherein the thickness of the substrate has a variation of up to 2 μm within a circle having a diameter of 125 mm.

14 Claims, 2 Drawing Sheets

RELATIONSHIP OF THICKNESSES

T≥C≥E

T≥C≥E

T>E>C

MOLD-FORMING SUBSTRATE AND INSPECTION METHOD

CROSS-REFERENCE TO RELATED APPLICATION

This non-provisional application claims priority under 35 U.S.C. § 119(a) on Patent Application No. 2011-027405 filed in Japan on Feb. 10, 2011, the entire contents of which are hereby incorporated by reference.

TECHNICAL FIELD

This invention relates to a substrate for forming a mold having a topological pattern-bearing surface for use in the process of fabricating electronic devices, optical components, storage components, bioelectronic components and the like, and a method for inspecting the substrate.

BACKGROUND ART

In the fabrication of electronic devices, optical components, storage components, bioelectronic components and the like, not only higher performance and further miniaturization are demanded, but also a reduction of the manufacture cost is required at the same time. Under the circumstances, the nanoimprint lithography (NIL) is highlighted since it can reduce the cost of micropatterning as compared with the conventional lithography processes. In the NIL process, a topological pattern is formed by mechanical means. Specifically a mold having a desired topological pattern on the surface is pressed to a resin layer of given thickness on a recipient substrate for thereby transferring the topological pattern on the mold to the resin layer. The resin layer to which the topological pattern has been transferred by pressing is cured whereby the shape of the resin layer is retained. The cure may be implemented by UV cure and heat cure modes. In either mode, it is important to press the mold and the recipient substrate together while maintaining parallelism between the mold and the recipient substrate and providing a uniform pressure within the contact plane.

CITATION LIST

Patent Document 1: JP-A 2002-318450 (U.S. Pat. No. 6,869,732, EP 1253117A1)

SUMMARY OF INVENTION

Mold-forming substrates used in the NIL process have different outer shapes including rectangular shape of 65 mm squares or 152 mm squares, and circular shape having a diameter of 50 mm, 100 mm, 150 mm or 200 mm, with a choice being made in accordance with the intended application. On the other hand, a region of the mold-forming substrate which plays the substantial mold role and on which a topological or protrusion/depression pattern is to be formed often has a smaller area (typically less than 4,000 mm$^2$) than the outer shape and is generally situated around the center of the mold-forming substrate. In general, there is a tendency that as the feature size of a pattern to be transferred becomes finer, the area where the pattern is formed becomes narrower.

The reason is that as the pattern feature size becomes finer, the accuracies required for mold-to-recipient substrate parallelism and pressure uniformity become higher; and if the area where the pattern is formed is narrower, these accuracies can be increased. On the other hand, the tendency that the outer shape of the mold is larger than the region where the pattern is formed is accounted for by the process of manufacturing a NIL mold. The NIL mold manufacture process generally includes a step of depositing a metal film by sputtering, a lithography step using an EB writer for transferring a desired nanostructure pattern to the metal film, and a step of dry etching the patterned metal film and the recipient substrate surface. From the aspects of economy and feasibility, these steps often utilize in a share manner those equipment used in the traditional lithography technology. Accordingly, the size of a mold-forming substrate loaded on these equipment inevitably corresponds to the size of substrates used in the traditional lithography technology, leading to the tendency that the outer shape of the NIL mold is sized larger than the region where the pattern is formed.

In recent years, the photo (UV) nanoimprint lithography encounters an increasing demand to provide a mold with a finer size pattern or more complex pattern for transfer. From such a demand and for the above-mentioned reason, the flatness of a mold-forming substrate, especially the flatness of a region which plays the substantial mold role and on which a pattern is to be formed is critical. As the pattern to be transferred is of finer size or more complex, a stronger possibility arises that unless the surface is fully flat, a misalignment may occur between the pattern during the mold manufacture and the pattern during the transfer step, leading to pattern errors.

An object of the invention is to provide a mold-forming substrate which enables to press a mold and a recipient substrate together under a uniform pressure within the contact plane while maintaining parallelism between the mold and the recipient substrate.

The inventors have found that the outstanding problem can be solved by a circular mold-forming substrate having a thickness which has a minimal variation in a central area where a topological pattern is to be formed, the variation being defined as a difference between maximum thickness and minimum thickness.

In one aspect, the invention provides a circular mold-forming substrate having a surface on which a topological pattern is to be formed and having a diameter of 125 mm to 300 mm and a thickness, wherein the thickness of the substrate has a variation of up to 2 μm within a circle having a diameter of up to 125 mm.

In a preferred embodiment, the substrate has a thickness variation of up to 10 μm over the entire surface.

Provided that the substrate, within the circle having a diameter of up to 125 mm, has a thickness T at the thickest point $\underline{t}$, a thickness C at the center $\underline{c}$, and a thickness E at point $\underline{e}$ of the intersections between line t-c and the periphery of a circle having a diameter of 125 mm which is remote from $\underline{t}$, these substrate thicknesses preferably meet the relationship: T≥C≥E. In a more preferred embodiment, the substrate thicknesses T and E within the circle having a diameter of up to 125 mm meet the relationship: 0.6 μm≥T−E≥0.3 μm.

The substrate is typically a quartz glass substrate and more typically a quartz glass substrate having a metal thin film or resist film for forming a transfer pattern.

In a preferred embodiment, defects with a size of up to 0.5 μm are present on the substrate surface within the circle having a diameter of up to 125 mm.

Most often the substrate is used in nanoimprint lithography.

In another aspect, the invention provides a method for inspecting a mold-forming substrate, comprising examining a substrate whether or not it complies with the requirement defined above for thereby judging the substrate to pass or fail.

Advantageous Effects of Invention

Using a circular mold-forming substrate having a surface on which a topological pattern is to be formed wherein the thickness of the substrate has a variation of less than or equal to 2 μm within a circle having a diameter of up to 125 mm, the occurrence of a pattern misalignment or pattern error between the step of forming a pattern on a mold-forming substrate and the transfer step is prevented. Transfer of a fine size and/or complex pattern is possible.

DESCRIPTION OF EMBODIMENTS

One embodiment of the invention is a circular mold-forming substrate having a surface on which a topological pattern is to be formed and having a diameter of 125 mm to 300 mm and a thickness, wherein the thickness of the substrate has a variation of less than or equal to 2 μm within a circle having a diameter of up to 125 mm. The substrate is especially suited to form a mold for use in the nanoimprint lithography.

Figure 1A:
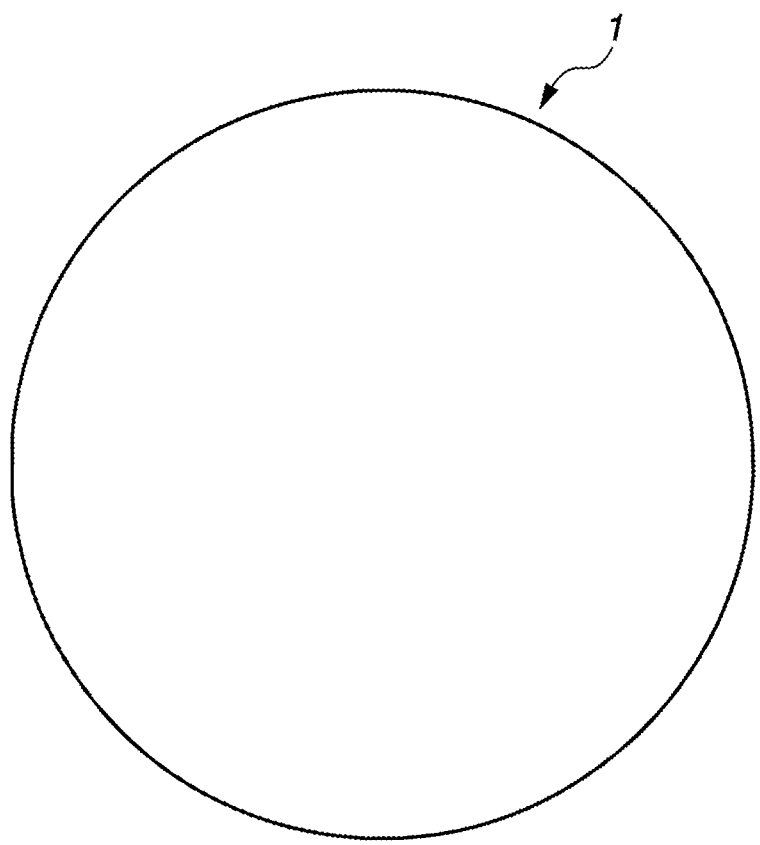
FIG. 1 schematically illustrates a mold-forming substrate in one embodiment of the invention, FIG. 1A being a plan view and FIG. 1B being a side view.
Figure 1B:
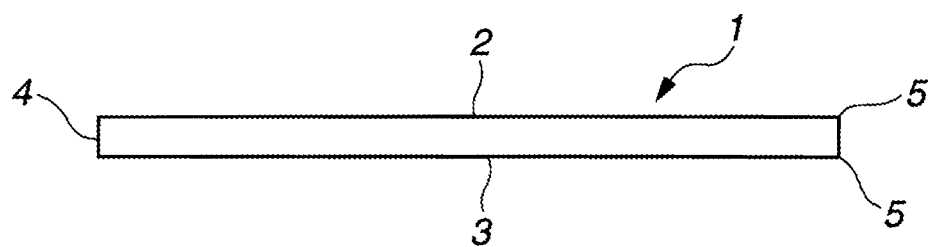

FIG. 1 illustrates a mold-forming substrate according to one embodiment of the invention. The substrate is of circular shape as shown in the plan view of FIG. 1A and has an upper surface 2, a lower surface 3, and a side surface 4 as shown in the side view of FIG. 1B. Most often, the corner 5 defined by the upper or lower surface 2 or 3 and the side surface 4 is chamfered. A metal thin film or resist film may be previously deposited on one surface (2 or 3) of the mold-forming substrate though not shown. It is noted that the circular substrate 1 has a thickness between the upper and lower surfaces 2 and 3 and a center.

In the embodiment, the thickness of the mold-forming substrate has a variation of less than or equal to 2 μm, preferably less than or equal to 1 μm, and more preferably less than or equal to 0.6 μm within a circle having a diameter of up to 125 mm. As used herein, the term "circle" refers to a circle about the center of the substrate. If the thickness variation or flatness exceeds 2 μm, a misalignment of pattern position or a pattern error can occur between the step of forming the pattern on the mold-forming substrate and the step of transferring the pattern on the mold. This is reflected, for example, in the transfer step of pressing the mold to a resin layer of given thickness on a recipient substrate, by a worsening of the parallelism between the mold and the recipient substrate and non-uniformity of the pressure within the contact plane. As a result, the thickness of the resin layer left after removal of the mold is non-uniform. Even after the subsequent steps such as dry etching and metal film removal, the overall process fails to form the desired pattern.

Although the lower limit of the thickness variation of the mold-forming substrate is not critical, a lower variation value leads to a lower thickness variation value within the circle having a diameter of up to 125 mm. The thickness of the mold-forming substrate is generally in a range of 0.1 to 30 mm, and preferably 0.5 to 10 mm. The area in which the thickness variation range is specified is defined as a circle having a diameter of up to 125 mm because the area of the NIL mold-forming substrate where the pattern is to be formed is a region sized about 125 mm or less, from the standpoints of accuracy and efficiency of the overall process. The thickness variation or flatness may be determined by measuring the thickness of the substrate at a plurality of points using a probe type thickness gauge, while more accurate measurement may be made by an optical interferometer or laser displacement sensor. The thickness referred to herein is a measurement using a flatness tester of optical interference system (FT90 by Nidek Co., Ltd.).

For ease of handling, the diameter of the mold-forming substrate is often up to 300 mm, preferably 125 mm to 200 mm. If the thickness of the substrate as a whole has a substantial variation, it is difficult to reduce the variation of thickness within a circle having a diameter of up to 125 mm. Even in a region of the substrate outside the pattern-forming region, a substantial variation of the substrate thickness can affect the transfer accuracy. For this reason, the variation of thickness over the entire substrate surface should preferably be up to 10 μm, more preferably up to 5 μm. Although the lower limit is not critical, it is preferred that the variation value be as low as possible. In a strict sense, the range in which the variation of substrate thickness over the entire surface is specified is a range where substantially accurate measurement is possible, that is, a circular region excluding an outer annular region extending 3 mm inward from the circumference. Since the annular region extending 3 mm inward from the circumference is located near the chamfered corner, the thickness of this region may not be accurately measured by a probe type thickness gauge which needs a wide area of measurement which may cover, in part, the chamfered corner. Even in the case of an optical interferometer or laser displacement sensor, measurement in the annular region extending 3 mm inward from the circumference, which is located near the edge or chamfered corner, may be less accurate due to the influence of scattering light.

Figure 2A:
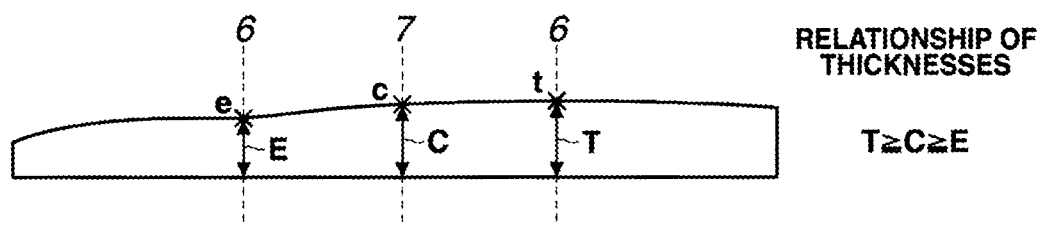
FIGS. 2A, 2B and 2C are cross-sectional views of mold-forming substrates with different thickness variations, FIGS. 2A and 2B illustrating the profiles of substrates satisfying the relationship: T≥C≥E according to the invention, FIG. 2C illustrating the profile of a substrate satisfying the relationship: T>E>C outside the preferred embodiment of the invention.
Figure 2B:
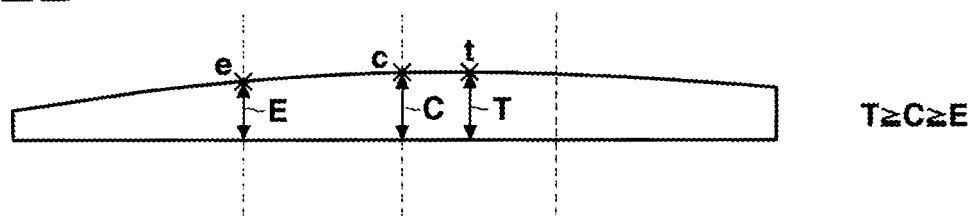

As shown in FIGS. 2A and 2B, within the circle having a diameter of up to 125 mm, the substrate has a thickness T at the thickest point t, a thickness C at the center c, and a thickness E at point e of the intersections between line t-c (i.e., line connecting points t and c) and the periphery of a circle having a diameter of 125 mm which is remote from t. In a preferred embodiment, these substrate thicknesses meet the relationship: T≥C≥E. In the figures, a broken line 6 passes the periphery of the circle having a diameter of 125 mm and a broken line 7 passes the center c of the substrate (and the circle having a diameter of 125 mm).

Figure 2C:
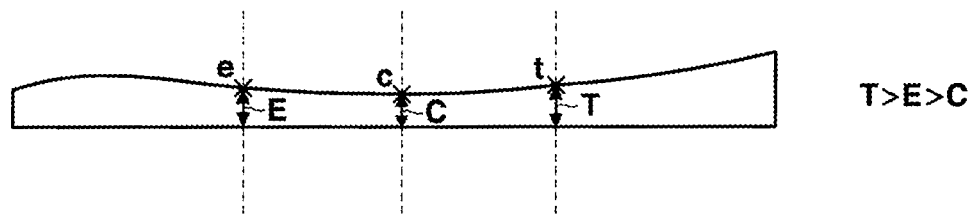

The mold pattern transfer step has a problem that since the pattern to be transferred is of fine size, bubbles can be introduced between pattern features and eventually cause defects in the transferred pattern. The problem may be avoided by modifying the apparatus so that the transfer step may be carried out in a nearly vacuum atmosphere. Since the atmosphere is not complete vacuum, bubble-induced defects cannot be completely eliminated. If the mold-forming substrate is profiled so that the substrate thicknesses may meet the relationship: T≥C≥E, formation of defects from bubbles in the transfer step can be mitigated. When the substrate thicknesses meet the relationship: T≥C≥E, the site on the mold surface that first comes in contact with the resin layer on the recipient substrate is the point of maximum thickness T, and the site on the mold surface that last comes in contact with the resin layer on the recipient substrate is the point of thickness E. Since the point of thickness E is at the boundary of the pattern-formed region, bubbles or foreign particles, if any in the resin layer, will escape out of the pattern-formed region, giving no impact to the transferred pattern. On the other hand, if the mold-forming substrate is configured to such a profile that the substrate thicknesses may meet the relationship: T>E>C, as shown in FIG. 2C, then the site on the mold surface that last comes in contact with the resin layer on the recipient substrate is the point of thickness C. In this case, bubbles or foreign particles, if any in the resin layer, will collect near the center of the pattern-formed region, causing defects to the transferred pattern.

In the substrate configured to meet the relationship: $T \geq C \geq E$, a certain difference between thicknesses T and E is expected effective for preventing formation of defects on the pattern because bubbles or foreign particles will more readily escape. Specifically, the substrate is configured to meet the relationship: $0.6 \ \mu m \geq T-E \geq 0.3 \ \mu m$ in a preferred embodiment and $0.4 \ \mu m \geq T-E \geq 0.3 \ \mu m$ in a more preferred embodiment. If the difference is more than 0.6 μm, which indicates a thickness variation of more than 0.6 μm, then a misalignment can occur between the pattern to be formed on the mold-forming substrate and the pattern being transferred, resulting in pattern errors. If the difference is less than 0.3 μm, this substrate thickness difference is insufficient for bubbles or foreign particles to escape outside, and bubbles or foreign particles will rather collect near the center of the pattern-formed region, with a possibility of forming defects in the transferred pattern despite fulfillment of the relationship: $T \geq C \geq E$.

In one preferred embodiment, the mold-forming substrate is a quartz glass substrate. Due to its UV transmittance, the quartz glass substrate is often utilized in the nanoimprint technology that utilizes UV for curing of a resin layer. Although the NIL technology that utilizes heat for curing of a resin layer is also known, this technology is sensitive to thermal expansion. Thus the NIL technology that utilizes UV is allegedly suited for transferring a finer size pattern. Since quartz glass is transparent in the visible light spectrum as well, it has another advantage of easy alignment during the transfer step. Besides quartz glass, suitable materials for the mold-forming substrate for the NIL technology include silicon (Si), silicon oxide film, polydimethylsiloxane (PDMS), nickel (Ni), sapphire, and hybrid materials thereof.

The mold-forming substrate may have thereon a metal thin film or resist film for forming a transfer pattern. Preferably a metal thin film or resist film is deposited on the mold-forming substrate before a pattern is formed on the mold-forming substrate using an EB writing tool. The metal thin film or resist film may be deposited to a thickness of 5 nm to 5 μm by any standard method. It is preferred that the thickness variation be less than or equal to 2 μm within the circle having a diameter of up to 125 mm when the thickness of the substrate on which the film has been formed is measured.

While the mold-forming substrate may have some surface defects, those surface defects within the circle having a diameter of up to 125 mm should preferably have a size of up to 0.5 μm, more preferably up to 0.25 μm, and even more preferably up to 0.1 μm. The reason is that since a pattern having a feature size of the submicron to nanometer order is formed on the surface of the mold-forming substrate, defects, if any, on the surface of the mold-forming substrate can be transferred to the recipient substrate and in the same size. It is noted that the size of surface defects is measured by an atomic force microscope (AFM).

The mold-forming substrate of the invention may be obtained by polishing upper and lower surfaces of a substrate such that the thickness of the substrate may have a variation of up to 2 μm within a circle having a diameter of up to 125 mm. The polishing may be achieved by simultaneously polishing both the upper and lower surfaces by a double-side polishing machine or by polishing each surface by a single-side polishing machine, while feeding a polishing slurry containing abrasives. The single-side polishing machine uses a polishing plate which may be either larger or smaller than the mold-forming substrate. In the case of a synthetic quartz glass substrate, it may be prepared by slicing a synthetic quartz glass stock and lapping according to the standard procedure.

The polishing step generally includes a primary or rough polishing step and a final or precise polishing step. To configure the surface profile of a mold-forming substrate so as to have a thickness variation within the desired range, the rough polishing step prior to the precise polishing step is of significance. For example, the rough polishing step is by simultaneously polishing the upper and lower surfaces of a substrate by means of a double-side polishing machine. At this point, upper and lower polishing plates each having a polishing pad attached thereto should preferably have a higher flatness. The polishing pad may be made of rigid polyurethane foam or the like. In order that the polishing pad always maintain a high flatness on its surface, it is effective to carry out pellet dressing every several batches. Pellet dressing may be preferably carried out by using a dressing carrier such as a diamond pellet-laden dressing carrier, feeding a flow of water and abrasive grains, and applying a load of a balancing pressure to 30 gf/cm$^2$. Specifically, using a dressing carrier designed to fit in a gear of a selected polishing machine, the polishing pad surface is dressed for flatness for several minutes to several tens of minutes in the same manner as in ordinary polishing.

The polishing pad of rigid polyurethane foam commonly used in the rough polishing step is preferably provided with grooves so that the polishing slurry may spread over the entire substrate. Full coverage of the substrate with the polishing slurry minimizes in-plane polishing non-uniformity, resulting in a substrate with a minimal thickness variation. The shape of grooves in the polishing pad may be an array of striation having a plurality of parallel spaced-apart threads or furrows.

The polishing slurry for use in rough polishing may contain abrasive grains of silica, ceria, alundum, white alundum, FO (alumina-base abrasive by Fujimi Inc.), zirconia, SiC, diamond, titania, germania, etc. The abrasive grains may preferably have a particle size of 0.1 to 10 μm, more preferably 0.5 to 3 μm. The slurry may be a water slurry of such abrasive grains.

When the final precise polishing is intended to configure the profile of a substrate such that the substrate thicknesses T, C and E meet the relationship: $T \geq C \geq E$ wherein T, C and E are as defined above, the surface profile control during the final precise polishing is important. The substrate surface profile may be controlled otherwise, for example, by controlling the ratio of carrier rotation to plate revolution, or the position of holes in polishing carrier for receiving workpieces, i.e., the offset between the carrier center and the hole center. For effective profile control, it is preferred to confirm the thickness variation or profile at the end of lapping and rough polishing. Confirmation may be made by measurement using an optical interferometer or laser displacement sensor, with the optical interferometer being preferred.

The profile of the substrate after the rough polishing step is preferably such that the substrate after the final precise polishing may have a thickness variation in the specified range and meet the relationship of thicknesses: T C≥E. Specifically, the substrate having a relationship of C and E: C≥E at the end of rough polishing step has a thickness variation of preferably up to 1.5 μm, more preferably 0 to 1.0 μm within a circle having a diameter of up to 125 mm. If the thickness variation exceeds the range, because of the tendency of the final polishing step that the amount of material removal at the edge is greater than at the center of the substrate, sometimes the thickness variation in the circle having a diameter of up to 125 mm may not fall within 2 μm. If thicknesses E and C are approximately equal, that is, a difference between thicknesses E and C is about 0.1 μm, or if E>C, then it is preferred that the thickness variation in the circle having a diameter of up to 125 mm be equal to or less than 2 μm, more preferably 0 to 1.5 μm. If the thickness variation is too large, because of the tendency of the final polishing step that the amount of material removal at the edge is greater than at the center of the substrate, the fundamental thickness variation remains substantially unchanged or is rather reduced after the final polishing. Then the substrate profile after the rough polishing step has a larger permissible thickness variation value than in the case of C>E. However, if too large, the thickness variation within the circle having a diameter of up to 125 mm sometimes may not fall within 2 μm after the final polishing step. As alluded to previously, since the final precise polishing step has a tendency that the amount of material removal at the edge is greater than that at the center of the substrate, it is advantageous for reducing the thickness variation after the final polishing step that the thicknesses C and E are approximately equal or E>C at the end of rough polishing.

The final precise polishing step following the rough polishing step uses a polishing pad, which may be selected depending on the required surface quality, for example, from suede, urethane-impregnated non-woven fabric, flexible urethane foam and the like. If the polishing slurry is not distributed uniformly over the entire substrate, or if chips as abraded are trapped within the polishing pad without being quickly carried away, then the polishing rate becomes non-uniform within the substrate, resulting in a substantial thickness variation. This may be avoided by providing the polishing pad with grooves over its entire surface. The grooves help deliver the polishing slurry uniformly, the polishing slurry fully spreads throughout the substrate, and chips are quickly carried away through the grooves. Then the polishing rate can be controlled to improve a thickness variation. The shape of grooves may be an array of striation.

The precise polishing slurry may contain abrasive grains of silica, ceria, alundum, white alundum (WA), FO (alumina-base abrasive by Fujimi Inc.), zirconia, SiC, diamond, titania, germania, etc. The abrasive grains may preferably have a particle size of 5 to 1,000 nm, more preferably 10 to 150 nm. The preferred slurry may be a water slurry of such abrasive grains.

If the substrate thickness variation does not fall in the desired range even after the final polishing step, or if an extremely low thickness variation is required for a very fine size pattern to be formed, the thickness variation may be further reduced by implementing a plasma etching technique capable of locally etching away an extra thickness portion for flattening, or a polishing technique using a compact polishing tool for local polishing. Such local polishing technique is described, for example, in JP-A 2002-318450.

Another embodiment of the invention is a method for inspecting a mold-forming substrate by examining a substrate whether or not it complies with the above-mentioned requirement for thereby judging the substrate to pass or fail. Specifically the thickness of a substrate is measured by a flatness tester of optical interference system, a thickness variation is determined therefrom, and the substrate is judged to be acceptable or not when the variation falls inside or outside the range.

EXAMPLE

Examples of the invention are given below by way of illustration and not by way of limitation.

Example 1

A synthetic quartz glass stock was sliced and lapped, obtaining an intermediate wafer having a diameter of about 6 inches, a thickness of 1.0 mm, and lapped glass surfaces. The intermediate wafer was subjected to a rough polishing step using a rigid polyurethane foam pad in combination with cerium oxide abrasive grains having a relatively coarse particle size (average particle size 1.4 μm, trade name SHOROX by Showa Denko K.K.). The rough polishing was carried out using a double-side polishing machine. The surface of the polishing pad was controlled such that the wafer might have a desired profile and thickness variation, by forming grooves (groove pitch 3 cm, groove width 2 mm) in the surface of the rigid polyurethane foam pad, and performing diamond pellet dressing on the pad after the predetermined number of batches.

As a result of rough polishing, there was finished a wafer substrate of the desired design having a thickness of about 0.5 mm and a generally convex profile. The thickness of the wafer substrate was measured using a flatness tester of optical interference system (FT90 by Nidek Co., Ltd.). It is now provided that within the circle having a diameter of 125 mm, the substrate has a thickness T at the thickest point $\underline{t}$, a thickness C at the center $\underline{c}$, and a thickness E at point $\underline{e}$ of the intersections between line t-c and the periphery of a circle having a diameter of 125 mm which is remoter from $\underline{t}$. The wafer substrate at the end of rough polishing had thicknesses C and E satisfying C>E, and a thickness variation [(maximum substrate thickness)−(minimum substrate thickness)] of 0.3 μm within the circle having a diameter of 125 mm. The substrate was then subjected to precise polishing into a flat mirror finish. Polishing was carried out by using a double-side polishing machine, mounting it with a suede polishing pad provided with an array of grooves at a pitch of 3 cm, and feeding a polishing slurry containing cerium oxide based abrasive grains (average particle size 0.8 μm, Mirek®, Mitsui Mining & Smelting Co., Ltd.). At the end of polishing, the substrate was carefully cleaned and dried, before it was determined for thickness variation. The thickness of the substrate within the circle having a diameter of 125 mm was measured using a flatness tester of optical interference system (FT90 by Nidek Co., Ltd.), finding a very small thickness variation value [(maximum substrate thickness)−(minimum substrate thickness)] of 0.6 μm. A thickness variation over the entire surface was 2.1 μm. The substrate was of a generally convex profile having the maximum thickness at the center. On examination of the relationship of thicknesses T, C and E, they gave T−E=0.6 μm and met the relationship: T≥C≥E, on the basis of which the substrate was judged to pass the test. Surface defects with a size of up to 0.25 µm were found in the central region having a diameter of 125 mm.

Example 2

By the same procedure as in Example 1, a starting substrate was prepared and worked until rough polishing. The substrate at the end of rough polishing had thicknesses C and E satisfying C>E, and a thickness variation of 1.2 µm within the circle having a diameter of 125 mm. The substrate was then subjected to precise polishing as in Example 1. Using a compact polishing tool, a central portion of a convex profile was locally polished to reduce the thickness of the central portion.

The thickness of the substrate was measured, finding a very small thickness variation of 0.3 µm within the circle having a diameter of 125 mm. A thickness variation over the entire surface was 1.8 µm. The substrate was of a generally trapezoidal profile having a substantially constant thickness around the center which is greater than at the outer periphery. On examination of the relationship of thicknesses T, C and E, they gave T−E=0.3 µm and met the relationship: T≥C≥E, on the basis of which the substrate was judged to pass the test. Surface defects with a size of up to 0.25 µm were found in the central region having a diameter of 125 mm.

Example 3

By the same procedure as in Example 1, a starting substrate was prepared and worked until rough polishing. The substrate at the end of rough polishing had thicknesses C and E satisfying C>E, and a thickness variation of 1.2 µm within the circle having a diameter of 125 mm. The substrate was then subjected to precise polishing as in Example 1 except that the suede polishing pad and the cerium oxide based abrasive grains which had been used for several tens of polishing batches were used.

The thickness of the substrate was measured. While the thickness variation over the entire surface had a marginal value of 12.5 µm, the thickness variation within the circle having a diameter of 125 mm had a relatively good value of 1.8 µm. On examination of the relationship of thicknesses T, C and E, they met the relationship: T≥C≥E, on the basis of which the substrate was judged to pass the test.

Comparative Example 1

A synthetic quartz glass stock was sliced, lapped, and roughly polished. Note that the rough polishing step used a polishing pad of rigid polyurethane foam which had been used for several tens of polishing batches, without intermediate dressing with diamond pellets, and had a poor flatness on its surface, specifically a flatness of 50 µm. The wafer substrate at the end of rough polishing had thicknesses C and E satisfying E>C, and a thickness variation of 6.3 µm within the circle having a diameter of 125 mm.

The substrate was then subjected to precise polishing into a flat mirror finish. Polishing was carried out by using a double-side polishing machine, mounting it with a suede polishing pad provided with an array of grooves at a pitch of 3 cm, and feeding a polishing slurry containing cerium oxide based abrasive grains (average particle size 0.8 µm, Mirek®, Mitsui Mining & Smelting Co., Ltd.).

At the end of polishing, the substrate was carefully cleaned and dried, before it was determined for thickness variation. The thickness of the substrate was measured using a flatness tester of optical interference system (FT90 by Nidek Co., Ltd.). The substrate had a thickness variation [(maximum substrate thickness)−(minimum substrate thickness)] of 8.7 µm within the circle having a diameter of 125 mm and a thickness variation of 24.2 µm over the entire surface. The substrate was judged to fail the test.

Japanese Patent Application No. 2011-027405 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A circular mold-forming substrate comprising:
an outer area and a circular mold role area;
wherein the circular mold-forming substrate has a diameter of 125 mm to 300 mm;
wherein the circular mold role area is an area that is capable of forming a topological pattern;
wherein the outer area surrounds the circular mold role area;
wherein the circular mold role area has a diameter of up to 125 mm;
wherein a variation of thickness of the circular mold role area is up to 2 µm;
wherein the circular mold-forming substrate satisfies the relationship: T≥C≥E;
wherein within the circular mold role area has a thickness T at the thickest point t that first comes in contact with a resin layer on a recipient substrate, a thickness C at the center c, and a thickness E at point e that is the intersection between line t-c and the periphery of the circular mold role area which is remote from t and last comes in contact with the resin layer on the recipient substrate; and
wherein the circular mold-forming substrate satisfies the relationship: 0.6 µm≥T-E≥0.3 µm.

2. The circular mold-forming substrate of claim 1, wherein the circular mold-forming substrate has a variation of thickness of up to 10 µm over the entire surface.

3. The circular mold-forming substrate of claim 1, wherein the circular mold-forming substrate is a quartz glass substrate.

4. The circular mold-forming substrate of claim 1, wherein the circular mold-forming substrate is a quartz glass substrate having a metal thin film or resist film for forming a transfer pattern.

5. The circular mold-forming substrate of claim 4, wherein the metal thin film or resist film has a thickness of 5 nm to 5 µm.

6. The circular mold-forming substrate of claim 4, wherein the metal thin film or resist film has a variation of thickness in the circular mold role area of up to 2 µm.

7. The circular mold-forming substrate of claim 1, wherein defects on the surface of the circular mold role area are present up to 0.5 µm.

8. The circular mold-forming substrate of claim 1, which is used in a nanoimprint lithography.

9. The circular mold-forming substrate of claim 1, wherein the variation of thickness of the circular mold role area is up to 1 µm.

10. The circular mold-forming substrate of claim 1, wherein the variation of thickness of the circular mold role area is up to 0.6 µm.

11. The circular mold-forming substrate of claim 1, wherein circular mold role area has a diameter of at least 50 mm.

12. The circular mold-forming substrate of claim 1, wherein the circular mold-forming substrate has a thickness of 0.1 to 30 mm.

13. The circular mold-forming substrate of claim 1, wherein the circular mold-forming substrate has a thickness of 0.5 to 10 mm.

14. The circular mold-forming substrate of claim 1, wherein defects on the surface of the circular mold role area are present up to 0.1 μm.

* * * * *